United States Patent
Krishnamurthi et al.

(10) Patent No.: US 10,447,220 B2
(45) Date of Patent: Oct. 15, 2019

(54) VARIABLE GAIN AMPLIFIER

(71) Applicant: BAE SYSTEMS INFORMATION AND ELECTRONIC SYSTEMS INTEGRATION INC., Nashua, NH (US)

(72) Inventors: Kathiravan Krishnamurthi, Westford, MA (US); Gregory M. Flewelling, Freeport, ME (US)

(73) Assignee: BAE Systems Information and Electronic Systems Integration Inc., Nashua, NH (US)

( * ) Notice: Subject to any disclaimer, the term of this patent is extended or adjusted under 35 U.S.C. 154(b) by 0 days.

(21) Appl. No.: 15/914,625

(22) Filed: Mar. 7, 2018

(65) Prior Publication Data

US 2019/0280661 A1    Sep. 12, 2019

(51) Int. Cl.
| | | |
|---|---|---|
| *H03F 3/68* | (2006.01) | |
| *H03F 7/04* | (2006.01) | |
| *H03F 1/34* | (2006.01) | |
| *H03F 1/26* | (2006.01) | |

(52) U.S. Cl.
CPC ............... *H03F 7/04* (2013.01); *H03F 1/26* (2013.01); *H03F 1/34* (2013.01)

(58) Field of Classification Search
CPC .................................. H03F 3/68; H03F 3/191
USPC ................................. 330/150, 305, 310, 311
See application file for complete search history.

(56) References Cited

U.S. PATENT DOCUMENTS

| | | | | |
|---|---|---|---|---|
| 3,449,686 | A * | 6/1969 | Bladen | H03G 1/007 200/81.9 M |
| 5,398,004 | A | 3/1995 | Kobayashi | |
| 6,806,778 | B1 | 10/2004 | Kobayashi | |
| 8,237,509 | B2 * | 8/2012 | Kim | H03F 1/223 330/124 R |
| 2002/0027477 | A1 * | 3/2002 | Kuwata | H03F 1/3229 330/310 |
| 2016/0181987 | A1 * | 6/2016 | Perreault | H03F 3/2176 330/251 |

OTHER PUBLICATIONS

Pietro Andreani and Sven Mattisson, "On the Use of MOS Varactors in RF VCO's", IEEE Journal of Solid-State Circuits, Jun. 2000, pp. 905-910, vol. 35, No. 6, Ericsson Mobil Communications AB, SE-221, 83 Lund, Sweden.

Jianhong Xio, Iuri Mehr, Jose Silva-Martinez, "A High Dynamic Range CMOS Variable Gain Amplifier for Mobile DTV Tuner", IEEE Journal of Solid-State Circuits, Feb. 2007, pp. 292-301, vol. 42, No. 2.

Analog Devices, "41 dB Range, 1dB Step Size, Programmable Dual VGA", Nov. 2007, pp. 1-16, One Technology Way, P. O. Box 9106, Norwood, MA 02062-9106.

(Continued)

*Primary Examiner* — Steven J Mottola
(74) *Attorney, Agent, or Firm* — Sand, Sebolt & Wernow; Scott J. Asmus

(57) ABSTRACT

A variable gain amplifier circuit including a first amplifier, a second amplifier, and a variable capacitor connected in series between the first amplifier and the second amplifier is disclosed. As a gain of the variable gain amplifier circuit varies, the input impedance, output impedance, noise figure and third-order output intercept point (OIP3) of the variable gain amplifier circuit remain unchanged.

17 Claims, 9 Drawing Sheets

(56) References Cited

OTHER PUBLICATIONS

Xuan, Ran Ding, Tom Baehr-Jones, Michael Hochberg, "A 92 mW, 20 dB gain, broadband lumped SiGe amplifier with bandwidth exceeding 67 GHz", 2013, pp. 107-110, IEEE Journal of Solid-State Circuits.

Ji-Tian Chen, Wan-Rong Zhang, Dong-Yue Jin, Hong-Yun Xie, Ya-Ze Liu, Xin Huang, Yan-Xiao Zhao, Shuo Liu, Cheng-Xiao Du, "An Ultra-Wideband Variable Gain Low Noise Amplifier", Research Lab of RF Devices and RFIC's, College of Electronic Information and Control Enginnering, 2016, 4 pages, IEEE Journal of Solid-State Circuits.

* cited by examiner

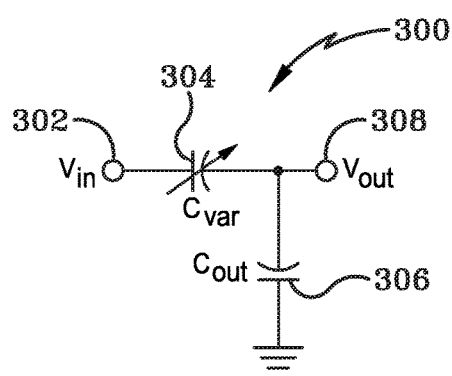
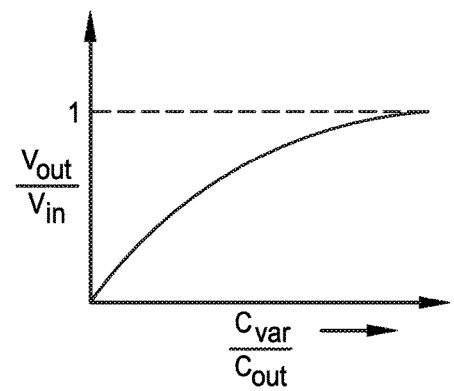
FIG.3A
FIG.3B
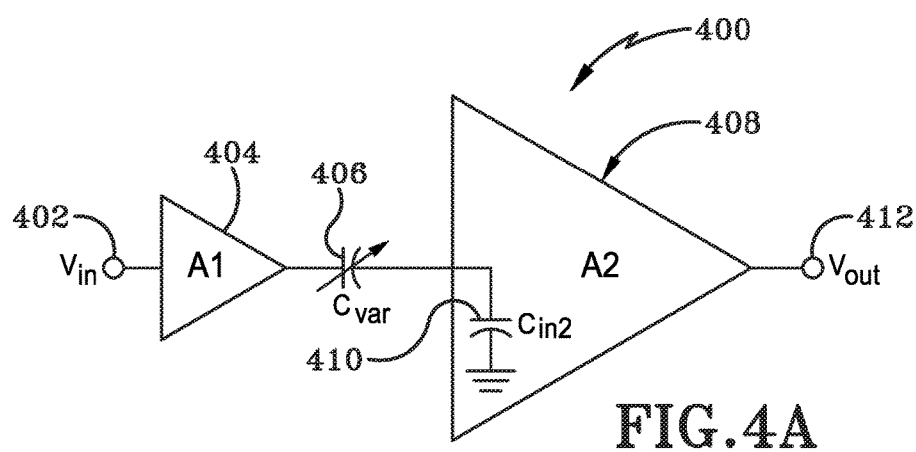
FIG.4A
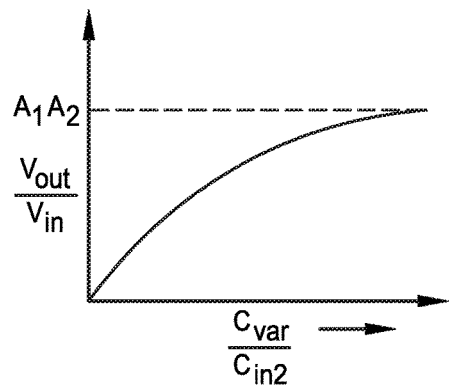
FIG.4B

VARIABLE GAIN AMPLIFIER

STATEMENT OF GOVERNMENT INTEREST

This present disclosure was made with United States Government support under Contract No. FA8650-17-C-7709 awarded by U.S. Dept. of the Air Force. The United States Government has certain rights in this disclosure.

BACKGROUND

Technical Field

The present disclosure relates to systems and methods for communication systems. More particularly, the present disclosure relates to radio frequency (RF) variable gain amplifiers. Specifically, the present disclosure relates to variable gain amplifiers having a variable gain that does not affect an input impedance, an output impedance, a noise figure and a third-order output intercept point (OIP3) of the variable gain amplifier circuit as the gain varies.

Background Information

Generally, radio frequency (RF) is any frequency within the electromagnetic spectrum associated with radio wave propagation. Typically, applying an RF current to an antenna creates an electromagnetic field that is able to propagate through space. One exemplary wireless technology that utilizes RF field propagation includes variable gain amplifiers.

Generally, a variable gain amplifier is an electronic device that varies its gain depending on a control voltage. However, there are some shortcomings related to conventional variable gain amplifiers including an undesirable change in noise figure and an undesirable change in third-order output intercept point (OIP3) as the gain varies.

SUMMARY

There remains a need in the art for an improved variable gain amplifier. The present disclosure addresses these and other issues.

In one aspect, the present disclosure may provide a variable gain amplifier circuit comprising a first amplifier, a second amplifier, and a variable capacitor connected in series between the first amplifier and the second amplifier. In one example, as a gain of the variable gain amplifier circuit varies, an input impedance, an output impedance, a noise figure and a third-order output intercept point (OIP3) of the variable gain amplifier circuit remain unchanged.

In one example, the first amplifier and the second amplifier are isolation amplifiers. In one example, the first amplifier is a Darlington transistor pair and the second amplifier is a cascode amplifier. The Darlington transistor pair and the cascode amplifier may have high reverse isolation.

The variable gain amplifier circuit may include a buffer amplifier connected between the first amplifier and the second amplifier.

In one example, a radio frequency (RF) voltage of the variable gain amplifier circuit may be split by the variable capacitor and an input capacitance of the second amplifier based, at least partially, on the capacitance of the variable capacitor.

In one example, the input impedance of the variable gain amplifier circuit is set by a shunt feedback resistor and an emitter degeneration resistor. In one example, the gain of the variable gain amplifier circuit is set by the shunt feedback resistor and the emitter degeneration resistor.

In one example, the first amplifier may include a real component of an output impedance and the second amplifier may include a real component of an input impedance where a sum of the first real component and the second real component are greater than zero.

In one example, the variable capacitor may include at least one field effect transistor (FET) and a control voltage. The control voltage may vary to change the capacitance of the variable capacitor.

In one example, the variable capacitor may include at least one switching device. The at least one switching device switches on and off to vary the gain of the variable gain amplifier circuit.

In another aspect, the present disclosure may provide a variable gain amplifier circuit comprising a first amplifier, a second amplifier, a third amplifier, a fourth amplifier, a first variable capacitor connected in series between the first amplifier and the second amplifier and a second variable capacitor connected in series between the third amplifier and the fourth amplifier. The variable gain amplifier circuit may further include a first shunt peaking inductor and a second shunt peaking inductor. In a differential implementation the first shunt peaking inductor and the second shunt peaking inductor are formed by mutually coupled tapped coils to reject common mode signals.

In one example, as a gain of the variable gain amplifier circuit varies, an input impedance, an output impedance, a noise figure and a third-order output intercept point (OIP3) of the variable gain amplifier circuit remain unchanged.

In another aspect, the present disclosure may provide a variable gain amplifier circuit including a first amplifier, a second amplifier, and a variable capacitor connected in series between the first amplifier and the second amplifier. As a gain of the variable gain amplifier circuit varies, an input impedance, an output impedance, a noise figure and a third-order output intercept point (OIP3) of the variable gain amplifier circuit remain unchanged.

BRIEF DESCRIPTION OF THE SEVERAL VIEWS OF THE DRAWINGS

Sample embodiments of the present disclosure are set forth in the following description, is shown in the drawings and is particularly and distinctly pointed out and set forth in the appended claims.

FIG. 3A is a schematic diagram of one embodiment of a circuit in accordance with one aspect of the present disclosure;

FIG. 3B is a graph of $V_{out}/V_{in}$ versus $C_{var}/C_{out}$ for the circuit of FIG. 3A;

FIG. 4A is a schematic diagram of one embodiment of a circuit in accordance with one aspect of the present disclosure;

FIG. 4B is a graph of $V_{out}/V_{in}$ (i.e. the gain of the first amplifier 404 multiplied by the gain of the second amplifier 408) versus $C_{var}/C_{in2}$ for the circuit of FIG. 4A;

Similar numbers refer to similar parts throughout the drawings.

DETAILED DESCRIPTION

Figure 1A:
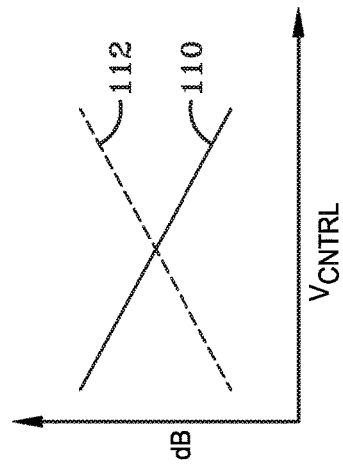
FIG. 1A is a schematic diagram of a PRIOR ART variable gain amplifier.

FIG. 1A illustrates a schematic view of a PRIOR ART variable gain amplifier 100 which includes an input port 102, a voltage variable attenuator 104, an amplifier 106 and an output port 108. The voltage variable attenuator 104 is a pi type voltage variable attenuator.

The input port 102 is connected to the voltage variable attenuator 104, the voltage variable attenuator 104 is connected to the amplifier 106, and the amplifier 106 is connected to the output port 108.

The operation of the PRIOR ART variable gain amplifier 100 is well known, and, for brevity purposes, will not be fully discussed herein; however, a brief description of the operation and one shortcoming of the PRIOR ART variable gain amplifier 100 will be discussed below.

Figure 1B:
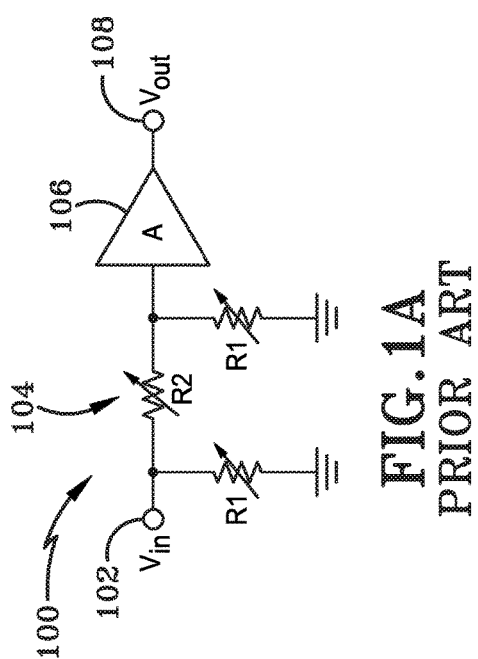
FIG. 1B is a graph of linear gain variation in decibel (dB) and linear noise figure variation in dB versus control voltage variation.

In operation, a radio frequency (RF) signal (not shown) enters the input port 102 and the voltage variable attenuator 104 attenuates the RF signal producing an attenuated RF signal. The attenuated RF signal enters the amplifier 106 and the amplifier 106 amplifies the attenuated RF signal producing an amplified RF signal. The amplified RF signal then passes through the output port 108. In this PRIOR ART embodiment, the gain of the variable gain amplifier 100 may be decreased by increasing the attenuation of the voltage variable attenuator 104. However, one drawback associated with this variable gain amplifier 100 is that as the gain decreases, the noise figure of the variable gain amplifier 100 increases as shown in FIG. 1B, which is a graph of linear gain variation in decibel (dB) and linear noise figure variation in dB versus control voltage variation. Line 110 represents the gain of the PRIOR ART variable gain amplifier 100 in dB and line 112 represents the noise figure of the PRIOR ART variable gain amplifier 100 in dB.

Figure 2A:
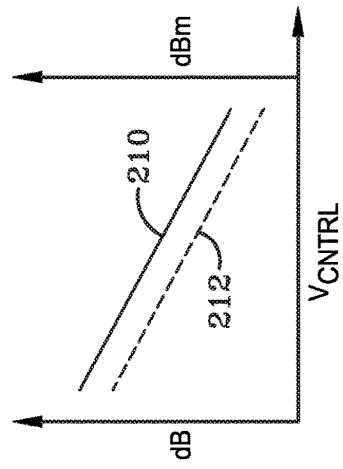
FIG. 2A a schematic diagram of a PRIOR ART variable gain amplifier.

FIG. 2A illustrates a schematic view of a PRIOR ART variable gain amplifier 200 which includes an input port 202, an amplifier 204, a voltage variable attenuator 206, and an output port 208. The voltage variable attenuator 206 is a pi type voltage variable attenuator.

The input port 202 is connected to the amplifier 204, the amplifier 204 is connected to the voltage variable attenuator 206, and the voltage variable attenuator is connected to the output port 208.

The operation of the PRIOR ART variable gain amplifier 200 is well known, and, for brevity purposes, will not be fully discussed herein; however, a brief description of the operation and one shortcoming of the PRIOR ART variable gain amplifier 200 will be discussed below.

Figure 2B:
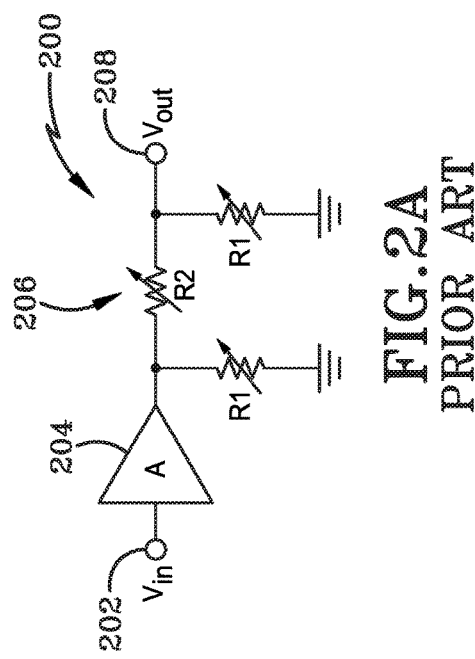
FIG. 2B is a graph of linear gain variation in decibel (dB) and linear third order intercept point (OIP3) variation in dBm versus control voltage variation.

In operation, a radio frequency (RF) signal (not shown) enters the input port 202 and the amplifier 204 amplifies the RF signal producing an amplified RF signal. The amplified RF signal enters the voltage variable attenuator 206 and the voltage variable attenuator 206 attenuates the amplified RF signal producing an attenuated RF signal. The attenuated RF signal then passes through the output port 208. In this PRIOR ART embodiment, the gain of the variable gain amplifier 200 may be decreased by increasing the attenuation of the voltage variable attenuator 206. However, one drawback associated with this variable gain amplifier 200 is that as the gain decreases, the third-order output intercept point (OIP3) decreases as shown in FIG. 2B, which is a graph of linear gain variation in dB and linear OIP3 variation in decibel-milliwatts (dBm) versus control voltage variation. Line 210 represents the gain of the PRIOR ART variable gain amplifier 200 in dB and line 212 represents the OIP3 of the PRIOR ART variable gain amplifier 200 in dB.

FIG. 3A is a schematic diagram of one embodiment of a circuit 300 in accordance with one aspect of the present disclosure. The circuit 300 may include an input port 302, a variable capacitor 304, a capacitor 306, and an output port 308.

The input port 302 is connected to the variable capacitor 304 and the variable capacitor 304 is connected to the capacitor 306 and the output port 308.

In operation, the capacitance of the variable capacitor 304 may be varied to split the RF signal voltage that enters into the output port 308 effectively varying the gain of the circuit 300. FIG. 3B is a graph of $V_{out}/V_{in}$ versus $C_{var}/C_{out}$ for the circuit 300 of FIG. 3A.

FIG. 4A is a schematic diagram of one embodiment of a circuit 400 in accordance with one aspect of the present disclosure. The circuit 400 may include an input port 402, a first amplifier 404, a variable capacitor 406, a second amplifier 408, a capacitor 410, and an output port 412.

The input port 402 is connected to the first amplifier 404, the first amplifier is connected to the variable capacitor 406, the variable capacitor 406 is connected to the second amplifier 408 and the capacitor 410, and the second amplifier 408 is connected to the output port 412.

In operation, the capacitance of the variable capacitor 406 may be varied to divide the voltage that enters into the second amplifier 408 effectively varying the gain of the circuit 400 without affecting the input impedance seen at the input port 402, the output impedance seen at the output port 412, the noise figure of the circuit 400 and the OIP3 of the circuit 400. FIG. 4B is a graph of $V_{out}/V_{in}$ versus $C_{var}/C_{in2}$ for the circuit 400 of FIG. 4A.

Figure 5:
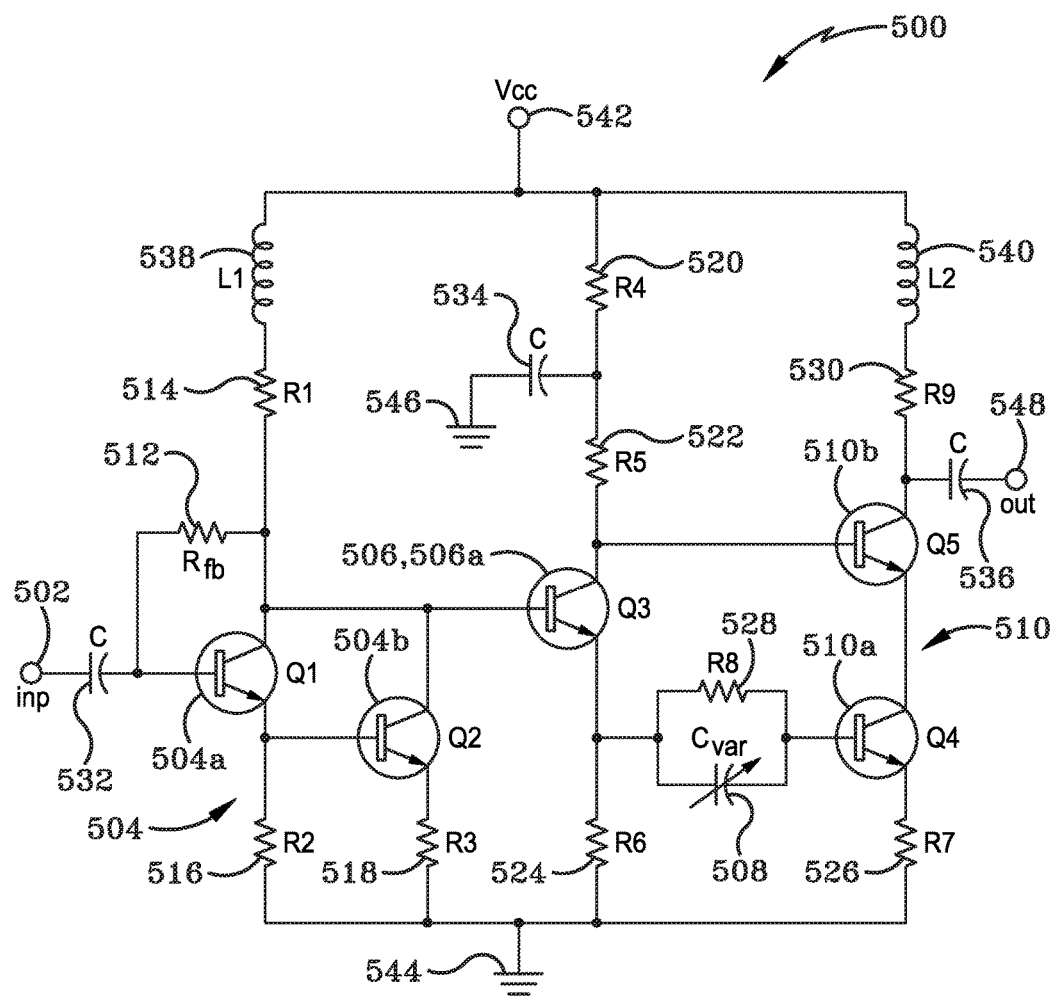
FIG. 5 is a schematic diagram of one embodiment of a variable gain amplifier in accordance with one aspect of the present disclosure.

FIG. 5 is a schematic diagram of one embodiment of a circuit 500 in accordance with one aspect of the present disclosure. The circuit 500 may include an input port 502, a Darlington transistor pair 504, a voltage buffer amplifier 506, a variable capacitor 508, a cascode amplifier 510, a shunt feedback resistor 512, a first resistor 514, a second resistor 516, a third resistor 518, a fourth resistor 520, a fifth resistor 522, a sixth resistor 524, a seventh resistor 526, an eighth resistor 528, a ninth resistor 530, a first capacitor 532, a second capacitor 534, a third capacitor 536, a first shunt-peaking inductor 538, a second shunt-peaking inductor 540, a voltage supply 542, a first ground 544, a second ground 546, and an output port 548.

The Darlington transistor pair 504 may include a first transistor 504*a* and a second transistor 504*b*. The buffer amplifier 506 may include a third transistor 506*a*. The cascode amplifier 510 may include a fourth transistor 510*a* and a fifth transistor 510*b*. The fourth transistor 510*a* is a common emitter transistor and the fifth transistor 510*b* is a common base emitter. In one example, the Darlington transistor pair 504 and the buffer amplifier 506 may form a first amplification stage and the fourth transistor 510*a* and the fifth transistor 510*b* may form a second amplification stage.

The input port 502 is connected to the first capacitor 532. The first capacitor 532 is connected to the base of the first transistor 504*a* and the shunt feedback resistor 512. The emitter of the first transistor 504*a* is connected to the second resistor 516 and the base of the second transistor 504*b*. The second resistor 516 is connected to the first ground 544. The collector of the first transistor 504*a* is connected to the collector of the second transistor 504*b* and the base of the third transistor 506*a* forming a node. The emitter of the second transistor 504*b* is connected to the third resistor 518. The third resistor 518 is connected to the first ground 544. The shunt feedback resistor 512 is connected across the base of the first transistor 504*a* and the node formed by the collector of the first transistor 504*a*, the collector of the second transistor 504*b* and the base of the third transistor 506*a*. The first resistor 514 is connected to the first shunt-peaking inductor 538 and the node formed by the collector of the first transistor 504*a*, the collector of the second transistor 504*b* and the base of the third transistor 506*a*. The first resistor 514 is connected across the shunt feedback resistor 512. The first shunt-peaking inductor 538 is connected to the voltage supply 542. The emitter of the third transistor 506*a* is connected to the sixth resistor 524, the variable capacitor 508 and the eighth resistor 528. The collector of the third transistor 506*a* is connected to the fifth resistor 522 and the base of the fifth transistor 510*b*. The sixth resistor 524 is connected to the first ground 544. The variable capacitor 508 is connected to the base of the fourth transistor 510*a*. The eighth resistor 528 is connected to the base of the fourth transistor 510*a*. The emitter of the fourth transistor 510*b* is connected to the seventh resistor 526. The seventh resistor 526 is connected to the first ground 544. The fifth resistor 522 is connected to the second capacitor 534, the fourth resistor 520, and the base of the fifth transistor 510*b*. The fourth resistor 520 is connected to the voltage supply 542 and the second shunt-peaking inductor 540. The second shunt-peaking inductor 540 is connected to the voltage supply 542 and the ninth resistor 530. The ninth resistor 530 is connected to the third capacitor 536 and the collector of the fifth transistor 510*b*. The collector of the fifth transistor 510*b* is connected to the third capacitor 536. The third capacitor 536 is connected to the output port 548.

In operation, an RF input signal (not shown) enters the base of the first transistor 504*a*. The RF input signal voltage is amplified and appears at the terminal formed by the collector of the first transistor 504*a*, the collector of the second transistor 504*b* and the base of the third transistor 506*a*. The third transistor 506*a* acts as a voltage buffer amplifier or an emitter follower which does not change the voltage gain of the amplified RF signal. The third transistor 506*a* also provides reverse isolation between the input of the first amplification stage and the variable capacitor 508. The third transistor 506*a* drives the cascode amplifier 510. In other words, the third transistor 506*a* presents the amplified voltage of the first transistor 504*a* and the second transistor 504*b* to the eighth resistor 528 to drive the fourth transistor 510*a*. The RF signal voltage from the third transistor 506*a* is amplified by the fourth transistor 510*a* and the fifth transistor 510*b* and is presented at the output port 548.

The first capacitor 532 and the third capacitor 536 serve as DC blocks. The shunt feedback resistor 512 takes a portion of the output voltage presented at the node formed by the collector of the first transistor 504*a*, the collector of the second transistor 504*b* and the base of the third transistor 506*a* and feeds it back to the base of the first transistor 504*a* which reduces the open-loop gain of the first amplification stage. As such, the shunt feedback resistor 512 may be utilized to set, at least in part, the gain of the first amplification stage and the input impedance of the first amplification stage. The second resistor 516 is an emitter degeneration resistor which reduces the gain and stabilizes the first transistor 504*a* through series feedback. As such, the second resistor 516 may be utilized to set, at least in part, the gain of the first amplification stage and the input impedance of the first amplification stage.

The third resistor 518 is an emitter degeneration resistor which stabilizes the second transistor 504*b* through series feedback. The first resistor 514 and the first shunt-peaking inductor 538 may serve as the load of the first amplification stage. The first shunt-peaking inductor 538 may increase the gain at higher frequencies for the first amplification stage.

The sixth resistor 524 may serve as the load for the third transistor 506*a*. The eighth resistor 528 allows a DC connection between the emitter of the third transistor 506*a* and the base of the fourth transistor 510*a*. In other words, the eighth resistor 528 provides a DC path to set up the bias of the fourth transistor 510*a*. The seventh resistor 526 is an emitter degeneration resistor which stabilizes the fourth transistor 510*a*. The second capacitor 534 may provide a ground path to the base of the fifth transistor 510*b*. The fourth resistor 520 and the fifth resistor 522 may set up a voltage bias for the base of the fifth transistor 510*b*.

The ninth resistor 530 and the second shunt-peaking inductor 540 may serve as the load of the second amplification stage. The second shunt-peaking inductor 540 may increase the gain at higher frequencies for the second amplification stage.

The first amplification stage and the second amplification stage each have an input impedance. In one example, the capacitance may be varied to control the amount of RF signal voltage applied to the second amplification stage (i.e. the fourth transistor 510*a*). The voltage entering the fourth transistor 510*a* may be varied by changing the value of the variable capacitor 508. If the capacitance of the variable capacitor 508 is the same as the input impedance of the fourth transistor 510*a*, then the voltage entering the fourth transistor 510*a* splits in half which in turn changes the voltage gain by half. In this example, the circuit 500 may accomplish a six dB gain variation by varying the capacitance of the variable capacitor 508 without affecting the noise figure of the circuit 500 and the OIP3 of the circuit 500.

Figure 6:
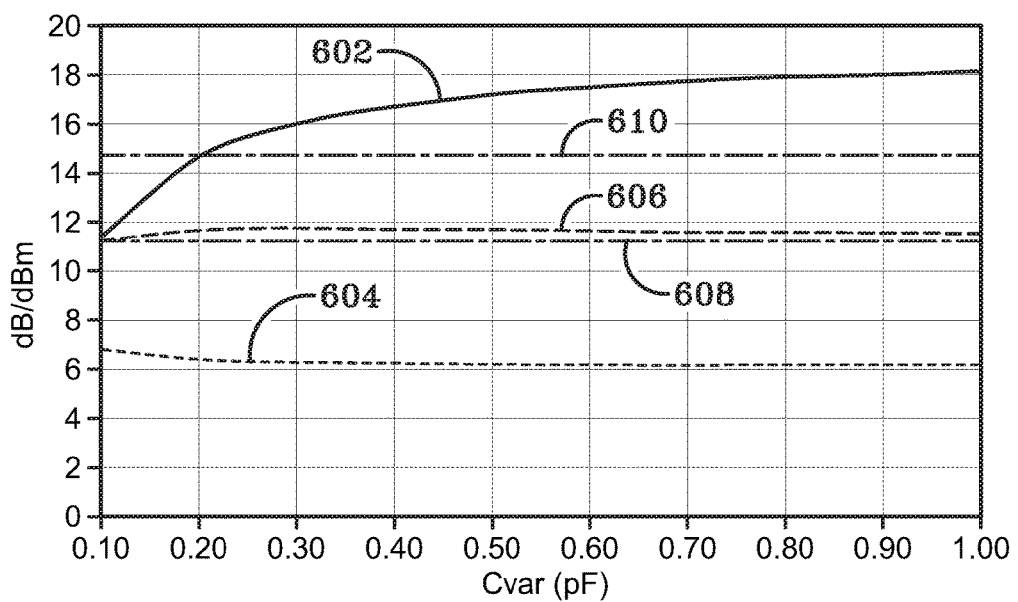
FIG. 6 is a graph of gain in dB, noise figure in dB, OIP3 in dBm, output return loss in dB and input return loss in dB versus capacitance in picofarads (pF) at an operating frequency of thirty gigahertz (GHz)

FIG. 6 is a graph of gain in dB, noise figure in dB, OIP3 in dBm, output return loss in dB and input return loss in dB versus capacitance in picofarads (pF) at an operating frequency of thirty gigahertz (GHz). The gain is represented by line 602, the noise figure is represented by line 604, the OIP3 is represented by line 606, the output return loss is represented by line 608 and the input return loss is represented by line 610. As shown in FIG. 6, as the gain increases, the noise figure, the OIP3, the output return loss and the input return loss are all unchanged.

Figure 7:
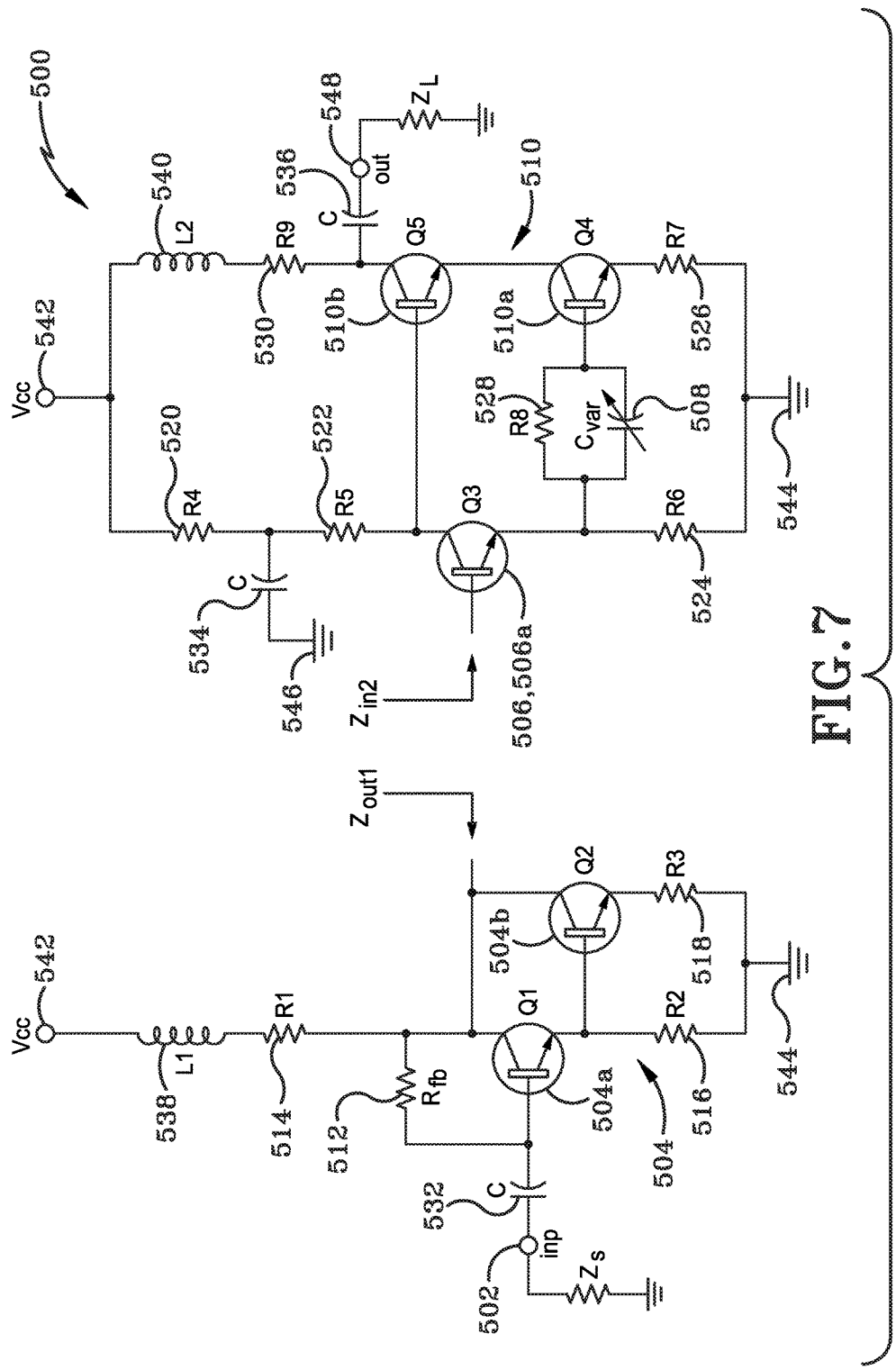
FIG. 7 is an exploded schematic diagram of the variable gain amplifier of FIG. 5.

In some instances, a multistage amplifier may be vulnerable to oscillation or lack of stability. With reference to FIG. 7, which is an exploded schematic diagram of the variable gain amplifier of FIG. 5 (i.e. it is the circuit 500 of FIG. 5 split between the second transistor 504*b* and the third transistor 506*a* showing an output impedance of the Darlington transistor pair 504 $Z_{out1}$ and the input impedance of the third transistor 506*a* $Z_{in2}$), the emitter follower (i.e. the third transistor 506*a*) is particularly vulnerable because the emitter is connected to the variable capacitor 508. The input impedance of the third transistor 506*a* at its base can have a negative real component of its input impedance which may cause the third transistor 506*a* to oscillate under certain conditions. One method for checking for stability is to compare the input impedance $Z_{in2}$ of the third transistor 506*a* to the output impedance $Z_{out1}$ of the Darlington transistor pair 504 under varying conditions of the variable capacitor 508.

Figure 8:
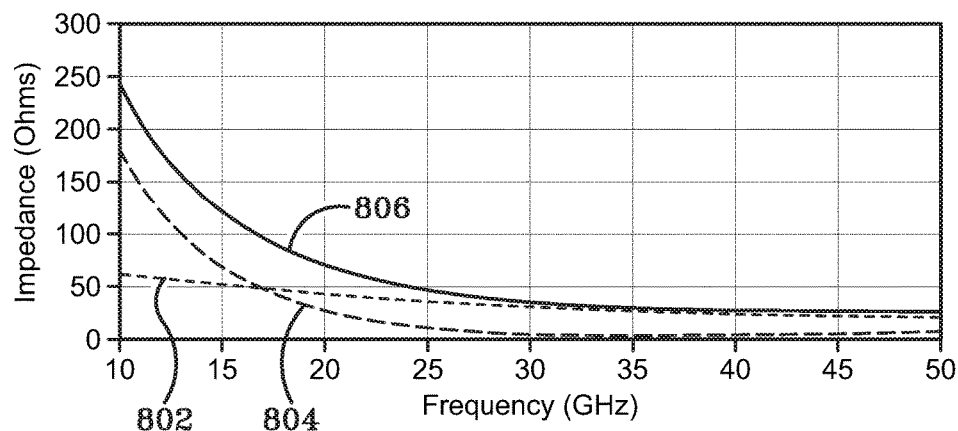
FIG. 8 is a graph of real components of impedance in ohms versus frequency in GHz when the variable capacitor is set such that the circuit exhibits a minimum gain.

FIG. 8 is a graph of real components of impedance in ohms versus frequency in GHz when the variable capacitor 508 is set such that the circuit 500 exhibits a minimum gain. The first line 802 represents the real component of output impedance $Z_{out1}$ of the Darlington transistor pair 504, the second line 804 represents the real component of input impedance of the third transistor 506*a* $Z_{in2}$, and the third line 806 represents the sum of the real component of the output impedance $Z_{out1}$ of the Darlington transistor pair 504 and the real component of the input impedance of the third transistor 506*a* $Z_{in2}$. As shown in FIG. 8, the sum of the real component of the output impedance $Z_{out1}$ of the Darlington transistor pair 504 and the real component of the input impedance of the third transistor 506*a* $Z_{in2}$ is always positive which means the third transistor 506*a* is stable.

Figure 9:
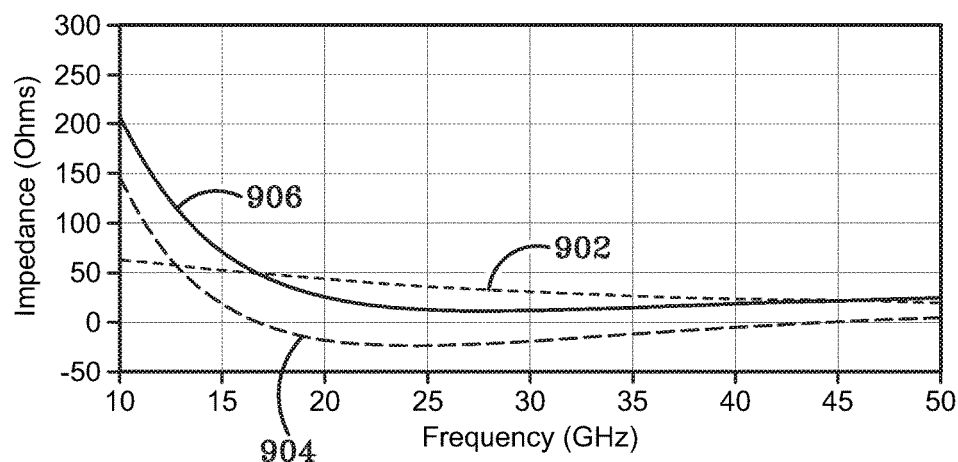
FIG. 9 is a graph of real components of impedance in ohms versus frequency in GHz when the variable capacitor is set such that the circuit exhibits a maximum gain.

FIG. 9 is a graph of real components of impedance in ohms versus frequency in GHz when the variable capacitor 508 is set such that the circuit 500 exhibits a maximum gain. The first line 902 represents the real component of the output impedance $Z_{out1}$ of the Darlington transistor pair 504, the second line 904 represents the real component of the input impedance of the third transistor 506*a* $Z_{in2}$, and the third line 906 represents the sum of the real component of the output impedance $Z_{out1}$ of the Darlington transistor pair 504 and the real component of the input impedance of the third transistor 506*a* $Z_{in2}$. As shown in FIG. 9, the sum of the real component of the output impedance $Z_{out1}$ of the Darlington transistor pair 504 and the real component of the input impedance of the third transistor 506*a* $Z_{in2}$ is always positive which means the third transistor 506*a* is stable. In one example, lowering the capacitance of the variable capacitor 508 to reduce the gain of the circuit 500 increases the real component of the input impedance of the third transistor 506*a* $Z_{in2}$.

Figure 10:
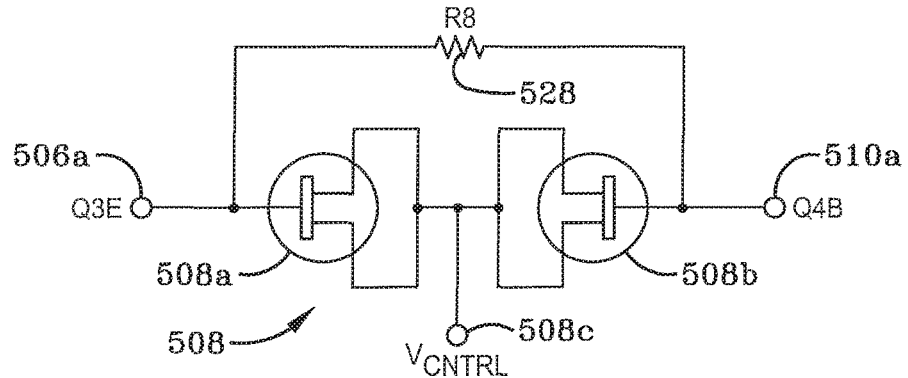
FIG. 10 is a partial schematic diagram of one embodiment of the variable capacitor connected to transistors.

Although the variable capacitor 508 may be any suitable variable capacitor, some exemplary variable capacitors are disclosed herein. FIG. 10 is a partial schematic diagram of one embodiment of the variable capacitor 508 connected to the third transistor 506*a* and the fourth transistor 510*a*. In this embodiment, the variable capacitor 508 may include a first field effect transistor (FET) 508*a*, a second FET 508*b*, and a voltage control 508*c*. In this example, the gate of the first FET 508*a* is connected to the third transistor 506*a* and the gate of the second FET 508*b* is connected to the fourth transistor. The drain and source of the first FET 508*a* and the second FET 508*b* are connected together and to the voltage control 508*c*. The voltage control 508*c* may supply a voltage that changes the capacitance of the variable capacitor 508.

Figure 11:
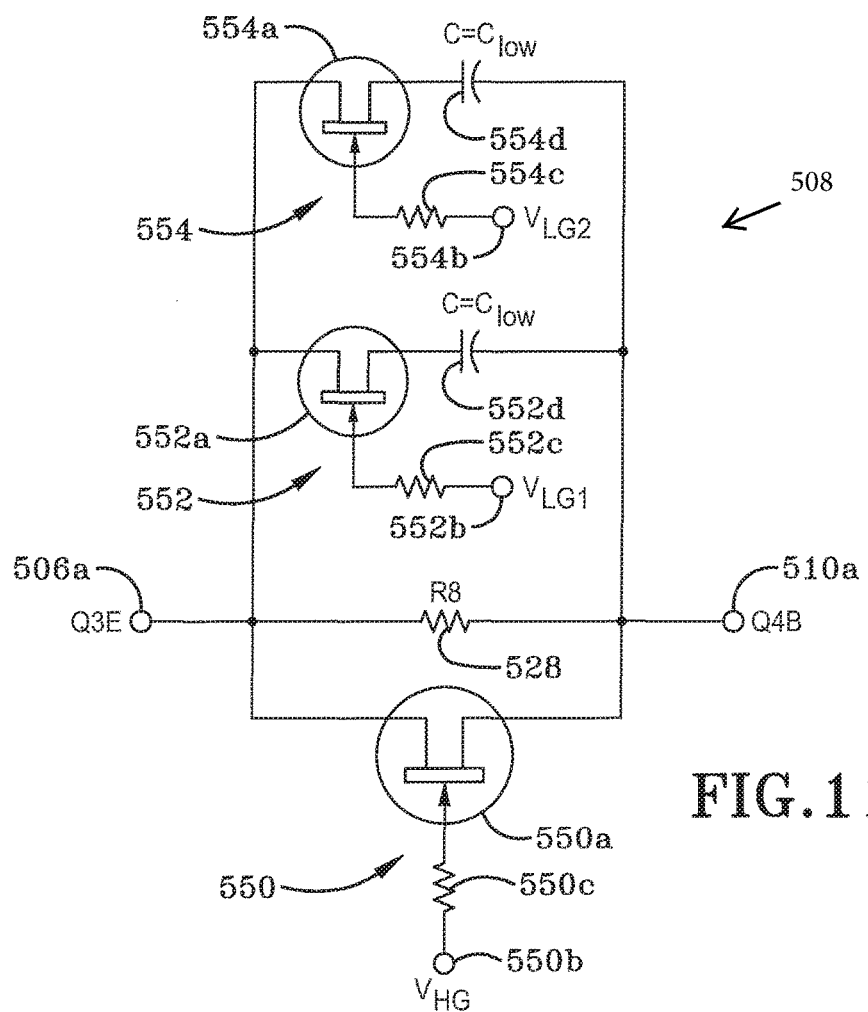
FIG. 11 is a partial schematic diagram of one embodiment of the variable capacitor connected to transistors.

FIG. 11 is a partial schematic diagram of one embodiment of the variable capacitor 508 connected to the third transistor 506*a* and the fourth transistor 510*a*. FIG. 11 represents a digital or switching approach to variable gain by having discrete values of capacitance across the eighth resistor 528. In this embodiment, the variable capacitor 508 may include a first switching device 550, a second switching device 552, and a third switching device 554. First switching device 550 may include a metal-oxide-semiconductor field-effect transistor (MOSFET) 550*a*, a voltage supply 550*b* and a resistor 550*c*. Second switching device may include a MOSFET 552*a*, a voltage supply 552*b*, a resistor 552*c* and a capacitor 552*d*. Third switching device may include a MOSFET 554*a*, a voltage supply 554*b*, a resistor 554*c* and a capacitor 554*d*.

The first switching device 550, the second switching device 552, and the third switching device 554 may be connected to the third transistor 506*a* and the fourth transistor 510*a*.

In operation, the first switching device 550, the second switching device 552, and the third switching device 554 may be switched on and off to vary the capacitance and the gain of the circuit 500. The gain is at its lowest when the first switching device 550 and the second switching device 552 are switched off and the third switching device 554 is switched on. The gain is at its highest when the first switching device 550 is switched on and the second switching device 552 and the third switching device 554 are switched off. The gain is at an intermediate value when the first switching device 550 is switched off and the second switching device 552 and the third switching device 554 are switched on.

Figure 12:
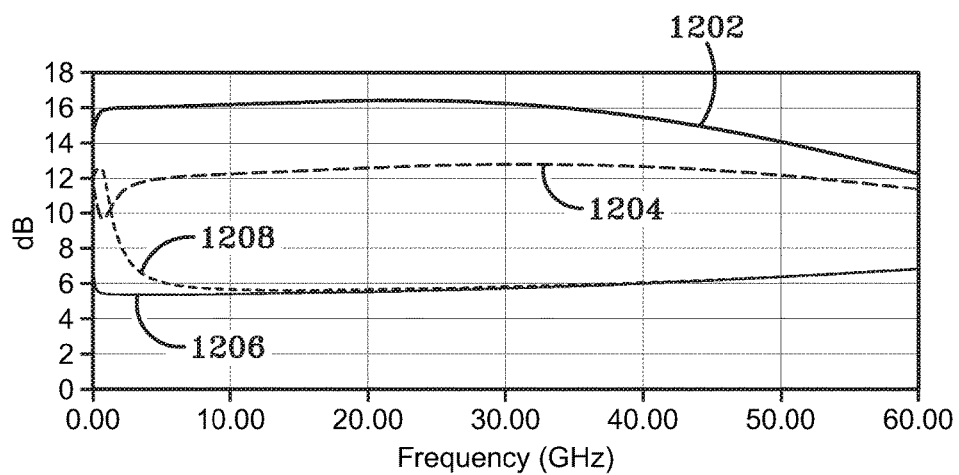
FIG. 12 a graph of gain switching performance in terms of gain in dB and noise figure in dB versus frequency in GHz.

FIG. 12 is a graph of gain switching performance in terms of gain in dB and noise figure in dB versus frequency in GHz. Line 1202 represents a maximum gain (gain high), line 1204 represents a minimum gain (gain low), line 1206 represents a noise figure when the gain is at its maximum and line 1208 represents a noise figure when the gain is at a minimum.

Figure 13:
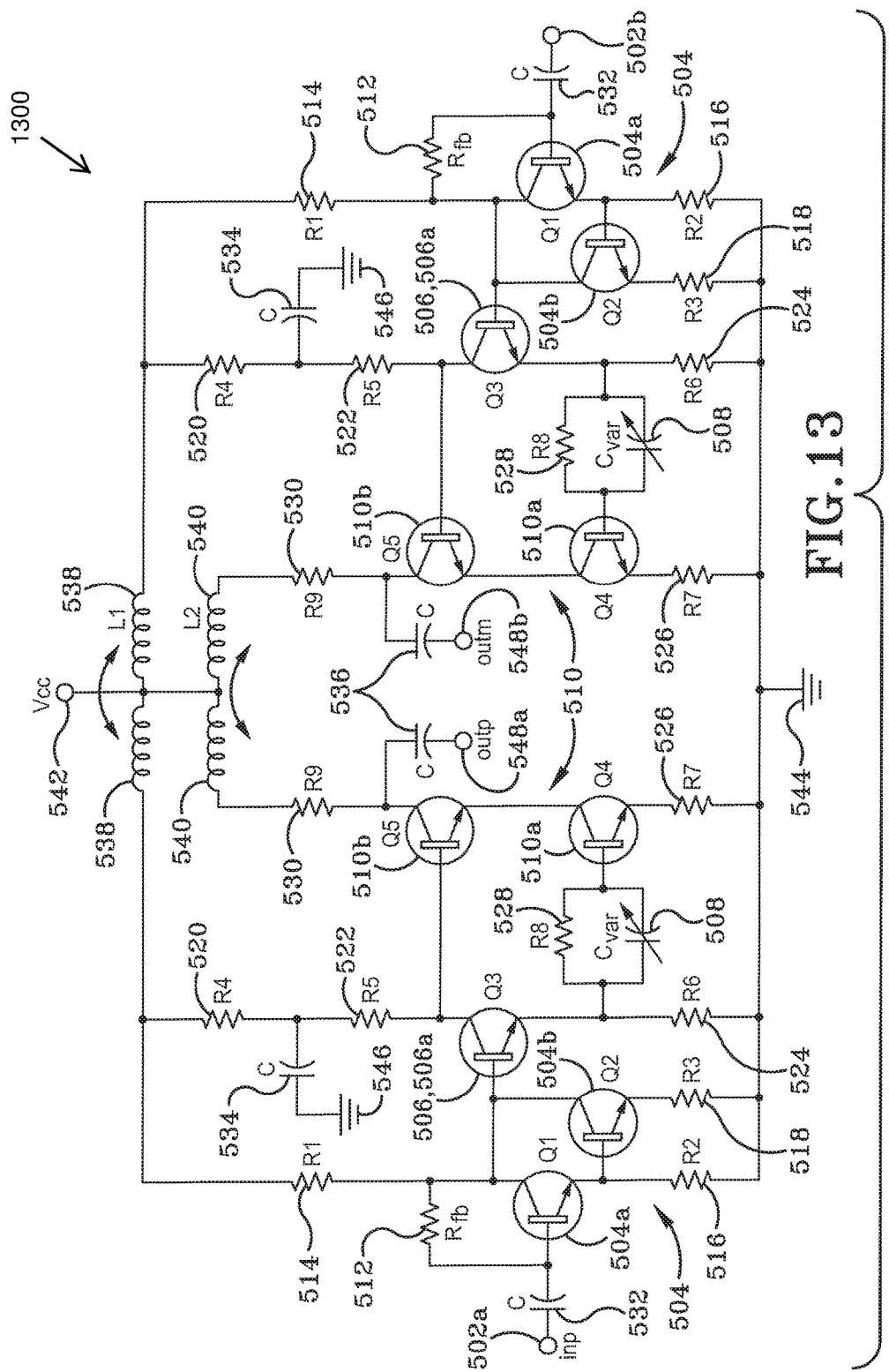
FIG. 13 is a schematic view of one embodiment of a variable gain amplifier in accordance with one aspect of the present disclosure.

FIG. 13 is a schematic view of one embodiment of a differential circuit 1300 in accordance with one aspect of the present disclosure. The circuit 1300 is substantially identical to the circuit 500 in structure and function with a few exceptions/additions that will be discussed hereafter in greater detail. Instead of having one circuit 500, circuit 1300 includes two circuits 500 combined to form a differential variable gain amplifier circuit. Circuit 1300 includes a first amplifier 504, first voltage buffer amplifier 506, a second amplifier 510, a third amplifier 504, a second voltage buffer amplifier 506, a fourth amplifier 510, a positive input terminal 502*a*, a negative input terminal 502*b*, a positive output terminal 548*a*, and a negative output terminal 548*b*. The first amplifier 504 is connected to the positive input terminal 502*a* and the first voltage buffer amplifier 506. The first voltage buffer amplifier 506 is connected to the second amplifier 510. The second amplifier 510 is connected to the positive output terminal 548*a*. The third amplifier 504 is connected to the positive input terminal 502*b* and the second voltage buffer amplifier 506. The second voltage buffer amplifier 506 is connected to the fourth amplifier 510. The fourth amplifier 510 is connected to the positive output terminal 548*b*. Further, in this embodiment, the first shunt peaking inductor 538 and the second shunt peaking inductor 540 are formed by mutually coupled coils with a tap for supply connection. Circuit 1300 operates in a substantially identical manner to circuit 500, except that the first shunt peaking inductor 538 and the second shunt peaking inductor 540 reject common mode signals.

Various inventive concepts may be embodied as one or more methods, of which an example has been provided. The acts performed as part of the method may be ordered in any suitable way. Accordingly, embodiments may be constructed in which acts are performed in an order different than illustrated, which may include performing some acts simultaneously, even though shown as sequential acts in illustrative embodiments.

While various inventive embodiments have been described and illustrated herein, those of ordinary skill in the art will readily envision a variety of other means and/or structures for performing the function and/or obtaining the results and/or one or more of the advantages described herein, and each of such variations and/or modifications is deemed to be within the scope of the inventive embodiments described herein. More generally, those skilled in the art will readily appreciate that all parameters, dimensions, materials, and configurations described herein are meant to be exemplary and that the actual parameters, dimensions, materials, and/or configurations will depend upon the specific application or applications for which the inventive teachings is/are used. Those skilled in the art will recognize, or be able to ascertain using no more than routine experimentation, many equivalents to the specific inventive embodiments described herein. It is, therefore, to be understood that the foregoing embodiments are presented by way of example only and that, within the scope of the appended claims and equivalents thereto, inventive embodiments may be practiced otherwise than as specifically described and claimed. Inventive embodiments of the present disclosure are directed to each individual feature, system, article, material, kit, and/or method described herein. In addition, any combination of two or more such features, systems, articles, materials, kits, and/or methods, if such features, systems, articles, materials, kits, and/or methods are not mutually inconsistent, is included within the inventive scope of the present disclosure.

All definitions, as defined and used herein, should be understood to control over dictionary definitions, definitions in documents incorporated by reference, and/or ordinary meanings of the defined terms.

An embodiment is an implementation or example of the present disclosure. Reference in the specification to "an embodiment," "one embodiment," "some embodiments," "one particular embodiment," "an exemplary embodiment," or "other embodiments," or the like, means that a particular feature, structure, or characteristic described in connection with the embodiments is included in at least some embodiments, but not necessarily all embodiments, of the invention. The various appearances "an embodiment," "one embodiment," "some embodiments," "one particular embodiment," "an exemplary embodiment," or "other embodiments," or the like, are not necessarily all referring to the same embodiments.

Additionally, the method of performing the present disclosure may occur in a sequence different than those described herein. Accordingly, no sequence of the method should be read as a limitation unless explicitly stated. It is recognizable that performing some of the steps of the method in a different order could achieve a similar result.

In the foregoing description, certain terms have been used for brevity, clearness, and understanding. No unnecessary limitations are to be implied therefrom beyond the requirement of the prior art because such terms are used for descriptive purposes and are intended to be broadly construed.

Moreover, the description and illustration of various embodiments of the disclosure are examples and the disclosure is not limited to the exact details shown or described.

The invention claimed is:

1. A variable gain amplifier circuit comprising:
   a first amplifier;
   a second amplifier;
   a variable capacitor connected in series between the first amplifier and the second amplifier;
   a shunt feedback resistor; and
   an emitter degeneration resistor,
   wherein the shunt feedback resistor and the emitter degeneration resistor set at least one of an input impedance and a gain of the first amplifier.

2. The variable gain amplifier circuit of claim 1, further comprising:
   an input impedance of the variable gain amplifier circuit; and
   a gain of the variable gain amplifier circuit; wherein when the gain of the variable gain amplifier circuit varies the input impedance remains unchanged.

3. The variable gain amplifier circuit of claim 1, further comprising:
   an output impedance of the variable gain amplifier circuit; and
   a gain of the variable gain amplifier circuit; wherein when the gain of the variable gain amplifier circuit varies the output impedance remains unchanged.

4. The variable gain amplifier circuit of claim 1, further comprising:
   a noise figure of the variable gain amplifier circuit; and
   a gain of the variable gain amplifier circuit; wherein when the gain of the variable gain amplifier circuit varies the noise figure remains unchanged.

5. The variable gain amplifier circuit of claim 1, further comprising:
   a third-order output intercept point (OIP3) of the variable gain amplifier circuit; and
   a gain of the variable gain amplifier circuit; wherein when the gain of the variable gain amplifier circuit varies the OIP3 remains unchanged.

6. The variable gain amplifier circuit of claim 1, wherein the first amplifier and the second amplifier are high reverse isolation amplifiers.

7. The variable gain amplifier circuit of claim 1, wherein the first amplifier is a Darlington transistor pair and the second amplifier is a cascode amplifier.

8. The variable gain amplifier circuit of claim 1, further comprising:
   a buffer amplifier connected between the first amplifier and the second amplifier.

9. The variable gain amplifier circuit of claim 1, further comprising:
   a radio frequency (RF) signal voltage of the variable gain amplifier circuit; and
   an input capacitance of the second amplifier; wherein the variable capacitor and the input capacitance of the second amplifier split the RF signal voltage based on the capacitance of the variable capacitor.

10. The variable gain amplifier of claim 1, further comprising:
    an output impedance of the first amplifier comprising a first real component; and an input impedance of the second amplifier comprising a second real component; wherein a sum of the first real component and the second real component are greater than zero.

11. The variable gain amplifier circuit of claim 1, further comprising:
    at least one field effect transistor of the variable capacitor; and
    a control voltage of the variable capacitor; wherein the control voltage varies to change the capacitance of the variable capacitor.

12. The variable gain amplifier circuit of claim 1, further comprising:
    a gain of the variable gain amplifier circuit;
    at least one switching device of the variable capacitor; wherein the at least one switching device switches on and off to vary the gain of the variable gain amplifier circuit.

13. A variable gain differential amplifier circuit comprising:
    a first amplifier connected to a first input terminal;
    a second amplifier connected to a first output terminal;
    a first voltage buffer amplifier connected between the first amplifier and the second amplifier;
    a third amplifier connected to a second input terminal;
    a fourth amplifier connected to a second output terminal;
    a second voltage buffer amplifier connected between the third amplifier and the fourth amplifier;
    a first variable capacitor connected in series between the first amplifier and the second amplifier;
    a second variable capacitor connected in series between the third amplifier and the fourth amplifier;
    a first mutually coupled tapped shunt peaking inductor; and
    a second mutually coupled tapped shunt peaking inductor; wherein the first shunt peaking inductor and the second shunt peaking inductor reject common mode signals.

14. The variable gain amplifier circuit of claim 13, further comprising:
    an input impedance of the variable gain amplifier circuit; and
    a gain of the variable gain amplifier circuit; wherein when the gain of the variable gain amplifier circuit varies the input impedance remains unchanged.

15. The variable gain amplifier circuit of claim 13, further comprising:
    an output impedance of the variable gain amplifier circuit; and
    a gain of the variable gain amplifier circuit; wherein when the gain of the variable gain amplifier circuit varies the output impedance remains unchanged.

16. The variable gain amplifier circuit of claim 13, further comprising:
    a noise figure of the variable gain amplifier circuit; and
    a gain of the variable gain amplifier circuit; wherein when the gain of the variable gain amplifier circuit varies the noise figure remains unchanged.

17. The variable gain amplifier circuit of claim 13, further comprising:
    a third-order output intercept point (OIP3) of the variable gain amplifier circuit; and
    a gain of the variable gain amplifier circuit; wherein when the gain of the variable gain amplifier circuit varies the OIP3 remains unchanged.

* * * * *